(12) United States Patent
Korolik et al.

(10) Patent No.: US 8,323,420 B2
(45) Date of Patent: Dec. 4, 2012

(54) METHOD FOR REMOVING MATERIAL FROM SEMICONDUCTOR WAFER AND APPARATUS FOR PERFORMING THE SAME

(75) Inventors: Mikhail Korolik, San Jose, CA (US); Michael Ravkin, Sunnyvale, CA (US); John deLarios, Palo Alto, CA (US); Fritz C. Redeker, Fremont, CA (US); John M. Boyd, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 1078 days.

(21) Appl. No.: 11/174,080

(22) Filed: Jun. 30, 2005

(65) Prior Publication Data

US 2007/0000518 A1    Jan. 4, 2007

(51) Int. Cl.
B08B 7/00 (2006.01)
B08B 7/04 (2006.01)
B08B 3/00 (2006.01)

(52) U.S. Cl. .............. 134/30; 134/26; 134/37; 134/38; 134/21

(58) Field of Classification Search ............ 134/26, 134/28, 29, 30, 31, 35, 37, 38, 40, 21
See application file for complete search history.

(56) References Cited

U.S. PATENT DOCUMENTS

| | | | | |
|---|---|---|---|---|
| 2,113,453 A * | 4/1938 | Mitchell et al. | ........... | 8/108.1 |
| 2,593,057 A * | 4/1952 | Savoy | ............ | 507/214 |
| 3,037,887 A | 6/1962 | Brenner et al. | ........... | 134/22 |
| 3,212,762 A | 10/1965 | Carroll et al. | ........... | 261/124 |
| 3,436,262 A | 4/1969 | Crowe et al. | ........... | 134/10 |
| 3,617,095 A | 11/1971 | Lissant | ............ | 406/197 |
| 3,978,176 A | 8/1976 | Voegeli | ............ | 261/122 |
| 4,085,059 A | 4/1978 | Smith et al. | ........... | 134/26 |
| 4,133,773 A | 1/1979 | Simmons | ............ | 261/21 |
| 4,156,619 A | 5/1979 | Griesshammer | ......... | 134/2 |
| 4,238,244 A | 12/1980 | Banks | ............ | 134/22 |
| 4,780,150 A * | 10/1988 | Anderson et al. | ........... | 134/3 |
| 4,781,764 A | 11/1988 | Leenaars | ............ | 134/34 |
| 4,817,652 A | 4/1989 | Liu et al. | ........... | 134/102 |

(Continued)

FOREIGN PATENT DOCUMENTS

EP        0827188        3/1998

(Continued)

OTHER PUBLICATIONS

Aubert, JM et al.; "Aqueous foams"; Scientific America; 1986, 75-82, 254.

(Continued)

*Primary Examiner* — Alexander Markoff
(74) *Attorney, Agent, or Firm* — Martine Penilla Group, LLP

(57) ABSTRACT

A pressure is maintained within a volume within which a semiconductor wafer resides at a pressure that is sufficient to maintain a liquid state of a precursor fluid to a non-Newtonian fluid. The precursor fluid is disposed proximate to a material to be removed from the semiconductor wafer while maintaining the precursor fluid in the liquid state. The pressure is reduced in the volume within which the semiconductor wafer resides such that the precursor fluid disposed on the wafer within the volume is transformed into the non-Newtonian fluid. An expansion of the precursor fluid and movement of the precursor fluid relative to the wafer during transformation into the non-Newtonian fluid causes the resulting non-Newtonian fluid to remove the material from the semiconductor wafer.

23 Claims, 5 Drawing Sheets

U.S. PATENT DOCUMENTS

| | | | | |
|---|---|---|---|---|
| 4,838,289 | A | | 6/1989 | Kottman et al. ............... 134/153 |
| 4,844,047 | A | * | 7/1989 | Brehm et al. ............... 125/13.01 |
| 4,849,027 | A | | 7/1989 | Simmons ....................... 134/2 |
| 4,911,761 | A | | 3/1990 | McConnell et al. ............ 134/11 |
| 4,962,776 | A | | 10/1990 | Liu et al. ......................... 134/11 |
| 5,000,795 | A | | 3/1991 | Chung et al. ................... 134/37 |
| 5,048,549 | A | | 9/1991 | Hethcoat ................... 134/122 R |
| 5,102,777 | A | | 4/1992 | Lin et al. ...................... 430/331 |
| 5,105,556 | A | | 4/1992 | Kurokawa et al. ................ 34/12 |
| 5,113,597 | A | | 5/1992 | Sylla ................................. 34/22 |
| 5,175,124 | A | | 12/1992 | Winebarger .................. 437/180 |
| 5,181,985 | A | | 1/1993 | Lampert et al. ............... 156/635 |
| 5,200,051 | A | * | 4/1993 | Cozzette et al. ........... 204/403.07 |
| 5,226,969 | A | | 7/1993 | Watanabe et al. ................ 134/7 |
| 5,242,669 | A | | 9/1993 | Flor .............................. 423/465 |
| 5,271,774 | A | | 12/1993 | Leenaars et al. ............... 134/31 |
| 5,288,332 | A | | 2/1994 | Pustilnik et al. ............... 134/27 |
| 5,306,350 | A | | 4/1994 | Hoy et al. .................. 134/22.14 |
| 5,336,371 | A | | 8/1994 | Chung et al. ................ 156/659.1 |
| 5,415,191 | A | | 5/1995 | Mashimo et al. .......... 134/102.1 |
| 5,417,768 | A | | 5/1995 | Smith et al. ..................... 134/10 |
| 5,464,480 | A | | 11/1995 | Matthews ...................... 134/1.3 |
| RE35,115 | E | * | 12/1995 | Winston et al. ................. 134/42 |
| 5,472,502 | A | | 12/1995 | Batchelder ...................... 118/52 |
| 5,494,526 | A | | 2/1996 | Paranjpe .......................... 134/1 |
| 5,498,293 | A | | 3/1996 | Ilardi et al. ...................... 134/3 |
| 5,558,109 | A | * | 9/1996 | Cala et al. ....................... 134/42 |
| 5,656,097 | A | | 8/1997 | Olesen et al. .................... 134/1 |
| 5,660,642 | A | | 8/1997 | Britten ............................ 134/30 |
| 5,705,223 | A | | 1/1998 | Bunkofske .................... 427/240 |
| 5,800,626 | A | | 9/1998 | Cohen et al. .................. 134/1.3 |
| 5,858,283 | A | | 1/1999 | Burris ........................ 261/122.1 |
| 5,900,191 | A | | 5/1999 | Gray et al. ...................... 261/59 |
| 5,904,156 | A | | 5/1999 | Advocate, Jr. et al. ........... 134/2 |
| 5,908,509 | A | | 6/1999 | Olesen et al. ................. 134/1.3 |
| 5,911,837 | A | | 6/1999 | Matthews ......................... 134/2 |
| 5,932,493 | A | | 8/1999 | Akatsu et al. ................. 438/745 |
| 5,944,581 | A | | 8/1999 | Goenka .......................... 431/39 |
| 5,944,582 | A | | 8/1999 | Talieh ............................. 451/41 |
| 5,945,351 | A | | 8/1999 | Mathuni ....................... 438/706 |
| 5,951,779 | A | | 9/1999 | Koyanagi et al. ................ 134/2 |
| 5,958,144 | A | * | 9/1999 | Cala et al. ........................ 134/2 |
| 5,964,954 | A | | 10/1999 | Matsukawa et al. ............. 134/6 |
| 5,964,958 | A | | 10/1999 | Ferrell et al. .................... 134/26 |
| 5,968,285 | A | | 10/1999 | Ferrell et al. .................... 134/26 |
| 5,997,653 | A | | 12/1999 | Yamasaka ........................ 134/2 |
| 6,017,863 | A | * | 1/2000 | Cala et al. ..................... 510/200 |
| 6,048,409 | A | | 4/2000 | Kanno et al. .................... 134/34 |
| 6,049,996 | A | | 4/2000 | Freeman et al. ................ 34/362 |
| 6,081,650 | A | | 6/2000 | Lyons et al. .................... 386/95 |
| 6,090,217 | A | | 7/2000 | Kittle ............................... 134/11 |
| 6,092,538 | A | | 7/2000 | Arai et al. ...................... 134/1.3 |
| 6,152,805 | A | | 11/2000 | Takahashi ....................... 451/36 |
| 6,158,445 | A | | 12/2000 | Olesen et al. ................. 134/1.3 |
| 6,167,583 | B1 | | 1/2001 | Miyashita et al. ............... 15/77 |
| 6,228,563 | B1 | | 5/2001 | Starove et al. ................ 430/327 |
| 6,267,125 | B1 | | 7/2001 | Bergman et al. ........... 134/102.1 |
| 6,270,584 | B1 | | 8/2001 | Ferrell et al. .................. 134/26 |
| 6,272,712 | B1 | | 8/2001 | Gockel et al. .................... 15/77 |
| 6,276,459 | B1 | | 8/2001 | Herrick et al. ................. 169/14 |
| 6,286,231 | B1 | | 9/2001 | Bergman et al. ............... 34/410 |
| 6,290,780 | B1 | | 9/2001 | Ravkin ............................. 134/6 |
| 6,296,715 | B1 | | 10/2001 | Kittle ................................ 134/2 |
| 6,319,801 | B1 | | 11/2001 | Wake et al. ................... 438/585 |
| 6,352,082 | B1 | | 3/2002 | Mohindra et al. ........... 134/25.4 |
| 6,386,956 | B1 | | 5/2002 | Sato et al. ........................ 451/57 |
| 6,398,975 | B1 | | 6/2002 | Mertens et al. ................ 216/92 |
| 6,401,734 | B1 | | 6/2002 | Morita et al. ................. 134/153 |
| 6,423,148 | B1 | | 7/2002 | Aoki ................................ 134/3 |
| 6,439,247 | B1 | | 8/2002 | Kittle ........................... 134/102.1 |
| 6,457,199 | B1 | | 10/2002 | Frost et al. ....................... 15/77 |
| 6,491,043 | B2 | | 12/2002 | Mohindra et al. ........... 134/25.4 |
| 6,491,764 | B2 | | 12/2002 | Mertens et al. ................. 134/36 |
| 6,493,902 | B2 | | 12/2002 | Lin ................................ 15/302 |
| 6,513,538 | B2 | | 2/2003 | Chung et al. .................. 134/1.2 |
| 6,514,921 | B1 | | 2/2003 | Kakizawa et al. ............ 510/175 |
| 6,527,870 | B2 | | 3/2003 | Gotkis ............................. 134/6 |
| 6,532,976 | B1 | | 3/2003 | Huh et al. .................... 134/111 |
| 6,537,915 | B2 | | 3/2003 | Moore et al. .................. 438/692 |
| 6,562,726 | B1 | | 5/2003 | Torek et al. .................... 438/745 |
| 6,576,066 | B1 | | 6/2003 | Namatsu ......................... 134/30 |
| 6,594,847 | B1 | | 7/2003 | Krusell et al. .................. 15/102 |
| 6,616,772 | B2 | | 9/2003 | de Larios et al. ............... 134/21 |
| 6,733,596 | B1 | | 5/2004 | Mikhaylichenko et al. ...... 134/6 |
| 6,787,473 | B2 | | 9/2004 | Andreas ....................... 438/692 |
| 6,797,071 | B2 | | 9/2004 | Kittle ............................... 134/11 |
| 6,802,911 | B2 | | 10/2004 | Lee et al. ........................ 134/28 |
| 6,846,380 | B2 | | 1/2005 | Dickinson et al. ........ 156/354.31 |
| 6,851,435 | B2 | | 2/2005 | Mertens et al. ............... 134/99.1 |
| 6,874,516 | B2 | | 4/2005 | Matsuno et al. .............. 134/148 |
| 6,896,826 | B2 | | 5/2005 | Wojtczak et al. ............. 252/79.1 |
| 6,927,176 | B2 | | 8/2005 | Verhaverbeke et al. ...... 438/745 |
| 6,946,396 | B2 | | 9/2005 | Miyazawa et al. ............ 438/689 |
| 6,951,042 | B1 | | 10/2005 | Mikhaylichenko et al. ..... 15/77 |
| 7,122,126 | B1 | | 10/2006 | Fuentes ......................... 216/689 |
| 2002/0072482 | A1 | | 6/2002 | Sachdev et al. ............... 510/175 |
| 2002/0094684 | A1 | | 7/2002 | Hirasaki et al. ............... 438/689 |
| 2002/0121290 | A1 | | 9/2002 | Tang et al. ........................ 134/6 |
| 2002/0185164 | A1 | | 12/2002 | Tetsuka et al. ................ 134/148 |
| 2002/0195121 | A1 | | 12/2002 | Kittle ............................... 134/3 |
| 2003/0075204 | A1 | | 4/2003 | de Larios et al. ............... 134/21 |
| 2003/0148903 | A1 | | 8/2003 | Bargaje et al. ................ 510/130 |
| 2003/0171239 | A1 | * | 9/2003 | Patel et al. .................... 510/406 |
| 2003/0226577 | A1 | | 12/2003 | Orll et al. ..................... 134/1.3 |
| 2004/0002430 | A1 | | 1/2004 | Verhaverbeke ............... 510/175 |
| 2004/0053808 | A1 | | 3/2004 | Raehse et al. ................. 510/447 |
| 2004/0134515 | A1 | | 7/2004 | Castrucci ......................... 134/2 |
| 2004/0159335 | A1 | | 8/2004 | Montierth et al. .............. 134/10 |
| 2004/0163681 | A1 | | 8/2004 | Verhaverbeke ................ 134/28 |
| 2004/0261823 | A1 | | 12/2004 | de Larios ........................ 134/31 |
| 2005/0045209 | A1 | | 3/2005 | Tan ................................ 134/18 |
| 2005/0132515 | A1 | | 6/2005 | Boyd et al. ....................... 15/77 |
| 2005/0133060 | A1 | | 6/2005 | de Larios et al. .............. 134/1.3 |
| 2005/0133061 | A1 | | 6/2005 | de Larios et al. ................ 134/6 |
| 2005/0159322 | A1 | | 7/2005 | Min et al. ...................... 510/175 |
| 2005/0176606 | A1 | | 8/2005 | Konno et al. .................. 510/175 |
| 2005/0183740 | A1 | | 8/2005 | Fulton et al. .................... 134/3 |
| 2006/0201267 | A1 | | 9/2006 | Liu ............................... 74/89.2 |
| 2006/0283486 | A1 | | 12/2006 | de Larios et al. ............... 134/34 |
| 2006/0285930 | A1 | | 12/2006 | de Larios et al. ............. 406/197 |
| 2007/0000518 | A1 | | 1/2007 | Korolik et al. | |

FOREIGN PATENT DOCUMENTS

| | | |
|---|---|---|
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 | 7/2005 |

OTHER PUBLICATIONS

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Advanced Wafer-Cleaning Evolution"; <http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Colloge, Dublin; 1999.

Kittle, et al.; "Photoreisist Removal Using Aqueous Foam"; Internet; http://www.aquafoam.com/paper/SCCPresentation.pdf.

Kittle, et al.; "Aqueous Foam Drying and Cleaning of Semiconductor Wafers"; Internet; http://www.aquafoam.com/paper/SCCPresentation.pdf.

Kittle, et al.; "Foam Wafer Cleaning—Experimental Proof of Concept"; Internet; http://www.aquafoam.com/paper/Removalall.pdf.

Kittle, et al.; "Particulate Removal Using a Foam Medium"; Internet; http://www.aquafoam.com/paper/particulate.pdf.

Kittle, et al. "Removing Particles with a Foam Medium" Internet http://www.aquafoam.com/paper/A2C2foamedium.pdf.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC handbook of Chemistry and Physics; 1997.

* cited by examiner

US 8,323,420 B2

METHOD FOR REMOVING MATERIAL FROM SEMICONDUCTOR WAFER AND APPARATUS FOR PERFORMING THE SAME

BACKGROUND

During semiconductor fabrication, integrated circuits are created on a semiconductor wafer ("wafer") defined from a material such as silicon. To create the integrated circuits on the wafer, it is necessary to fabricate a large number (e.g., millions) of electronic devices such as resistors, diodes, capacitors, and transistors of various types. Fabrication of the electronic devices involves depositing, removing, and implanting materials at precise locations on the wafer. A process called photolithography is commonly used to facilitate deposition, removal, and implantation of materials at precise locations on the wafer.

In the photolithography process, a photoresist material is first deposited onto the wafer. The photoresist material is then exposed to light filtered by a reticle. The reticle is generally a glass plate that is patterned with exemplary feature geometries that block light from passing through the reticle. After passing through the reticle, the light contacts the surface of the photoresist material. The light changes the chemical composition of the exposed photoresist material. With a positive photoresist material, exposure to the light renders the exposed photoresist material insoluble in a developing solution. Conversely, with a negative photoresist material, exposure to the light renders the exposed photoresist material soluble in the developing solution. After the exposure to the light, the soluble portions of the photoresist material are removed, leaving a patterned photoresist layer.

The wafer is then processed to remove, deposit, or implant materials in the wafer regions not covered by the patterned photoresist layer. Such wafer processing often modifies the photoresist layer in such a way as to make removal of the photoresist more difficult. For example, in the case of a plasma etch process, the outer layer of the photoresist is transformed into a hard crust that is significantly less reactive that the underlying photoresist. After the wafer processing, the patterned photoresist layer, its debris, as well as other types of polymer debris left after plasma etching, need to be removed from the wafer in a process called photoresist stripping. It is important to completely remove the photoresist and polymer material during the photoresist stripping process because such materials remaining on the wafer surface may cause defects in the integrated circuits. Also, the photoresist stripping process should be performed carefully to avoid chemically modifying or physically damaging underlying materials present on the wafer. A need exists for improvement in the photoresist stripping process such that more complete removal of the photoresist and polymer material can be achieved while inflicting less chemical modification and/or damage to the underlying wafer materials.

SUMMARY

In one embodiment, a method is disclosed for removing material from a semiconductor wafer. The method includes an operation for maintaining a pressure in a volume within which the semiconductor wafer resides to be sufficient to maintain a liquid state of a precursor fluid to a non-Newtonian fluid. The method also includes an operation for disposing the precursor fluid on the semiconductor wafer while maintaining the precursor fluid in the liquid state. More specifically, the precursor fluid is disposed proximate to the material that is to be removed from the semiconductor wafer. The method further includes an operation for reducing the pressure in the volume within which the semiconductor wafer resides. The reduction in pressure causes the precursor fluid to transform into the non-Newtonian fluid. An expansion of the precursor fluid during the transformation into the non-Newtonian fluid causes the resulting non-Newtonian fluid to remove the material from the semiconductor wafer.

In another embodiment, a method is disclosed for removing photoresist and polymer material from a semiconductor wafer. The method includes an operation for disposing a solution on a semiconductor wafer to remove a bulk photoresist material. The solution penetrates through a photoresist material to remove the bulk photoresist material while leaving a photoresist crust. Following removal of the bulk photoresist material, a precursor fluid to a non-Newtonian fluid is disposed on the semiconductor wafer while being maintained in a liquid state. Also, the precursor fluid is disposed to penetrate through the photoresist crust to vacant regions underlying the photoresist crust. The method further includes an operation for reducing a pressure ambient to the semiconductor wafer to transform the precursor fluid into the non-Newtonian fluid. An expansion of the precursor fluid during the transformation into the non-Newtonian fluid causes the resulting non-Newtonian fluid to remove the photoresist crust and polymer material.

In another embodiment, an apparatus is disclosed for removing material from a semiconductor wafer. The apparatus includes a chamber having a fluid input connected thereto. The fluid input is configured to dispose a precursor fluid to a non-Newtonian fluid on the semiconductor wafer to be supported within the chamber. The apparatus also includes a pressurization device configured to control a pressure within the chamber. The pressurization device is capable of controlling a pressure within the chamber to maintain the precursor fluid in a liquid state when being disposed on the semiconductor wafer. The apparatus further includes a pressure release device configured to release a pressure within the chamber to a lower pressure environment. Release of the pressure within the chamber is sufficient to cause the precursor fluid to transform from the liquid state into the non-Newtonian fluid. An expansion of the precursor fluid during the transformation into the non-Newtonian fluid is sufficient to cause the resulting non-Newtonian fluid to remove the material from the semiconductor wafer.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
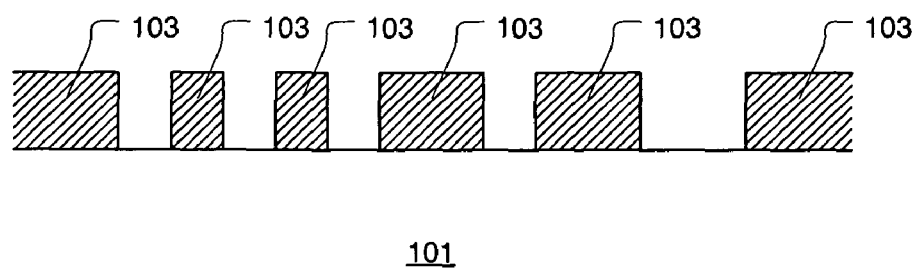
FIG. 1A is an illustration depicting a semiconductor wafer having a patterned photoresist layer defined thereon.

FIG. 1A is an illustration depicting a semiconductor wafer 101 having a patterned photoresist layer 103 defined thereon. It should be appreciated that the semiconductor wafer 101 can include a buildup of many different materials in various geometric arrangements, depending on the extent of semiconductor fabrication that has occurred thus far. The patterned photoresist layer 103 can be defined on the semiconductor wafer 101 using a common photolithography process. In the present discussion, the patterned photoresist layer 103 serves as a mask to protect covered portions of the semiconductor wafer 101 from a plasma used in a plasma etching process. Thus, the patterned photoresist layer 103 also defines a pattern that will be etched into the semiconductor wafer 101.

Figure 1B:
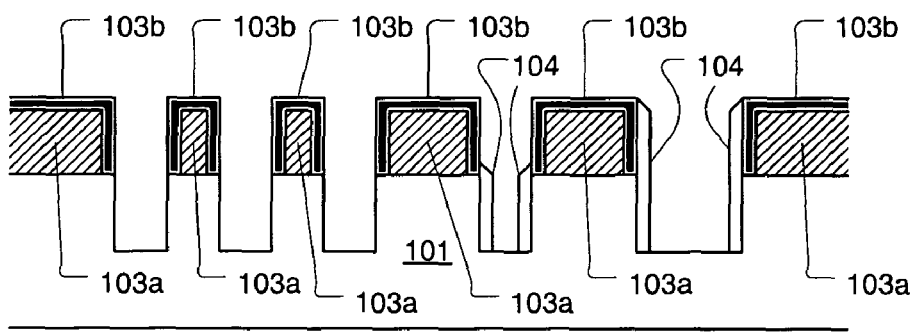
FIG. 1B is an illustration depicting the semiconductor wafer and patterned photoresist layer of FIG. 1A after having the plasma etching process performed thereon.

Some wafer processing operations, such as the plasma etching process of the present discussion, can transform a thickness of a patterned photoresist layer that is exposed to the plasma into a photoresist crust. FIG. 1B is an illustration depicting the semiconductor wafer 101 and patterned photoresist layer 103 of FIG. 1A after having the plasma etching process performed thereon. As shown in FIG. 1B, following the plasma etching process, the patterned photoresist layer 103 is defined by a bulk photoresist portion 103a and a photoresist crust 103b, wherein the bulk photoresist portion 103a underlies the photoresist crust 103b.

The photoresist material defining the bulk photoresist portion 103a is essentially the same as the photoresist material defining the patterned photoresist layer 103 prior to performing the plasma etching process. However, the photoresist crust 103b differs significantly from the bulk photoresist portion 103a. For example, in contrast to the bulk photoresist portion 103a, the photoresist crust 103b is a more rigid and porous material that adheres tenaciously to the semiconductor wafer 101 surface.

Additionally, the plasma etching process can leave a polymer material 104 on the semiconductor wafer 101 surface. During the etching process the polymer material 104 can be created by reaction of species within the plasma with by-products of the etching process. For example, the polymer material 104 can be a fluorocarbon based material that includes species from the substrate.

Following the plasma etching process, it is necessary to completely remove the bulk photoresist portion 103a, the photoresist crust 103b, and the polymer material 104. Additionally, the photoresist and polymer materials should be removed without causing chemical or physical damage to the underling features of the semiconductor wafer 101. One method for removing the bulk photoresist portion 103a involves performing a wet stripping operation. In the wet stripping operation, a wet strip chemistry is disposed over the semiconductor wafer 101 and photoresist materials. The wet strip chemistry is designed to penetrate through the porous photoresist crust 103a and remove the bulk photoresist portion 103a through a dissolution process. Some example wet strip chemistries include AP902 produced by ATMI, Inc. and EZStrip 523 produced by Air Products and Chemicals, Inc., among others. Many of the conventional wet strip chemistries are tetramethylammonium hydroxide (TMAH) based solutions that are designed to provide rapid removal of the bulk photoresist portion 103a while remaining benign to underlying features of the semiconductor wafer 101.

However, those skilled in the art will appreciate that while conventional wet strip chemistries are effective at removing the bulk photoresist portion 103a, the conventional wet strip chemistries are not capable of effectively removing the photoresist crust 103b without causing damage to the underlying features of the semiconductor wafer 101. Thus, conventional wet strip chemistries that are touted as being capable of removing the photoresist crust 103b are so aggressive that they cause damage to the underlying features of the semiconductor wafer 101.

Figure 1C:
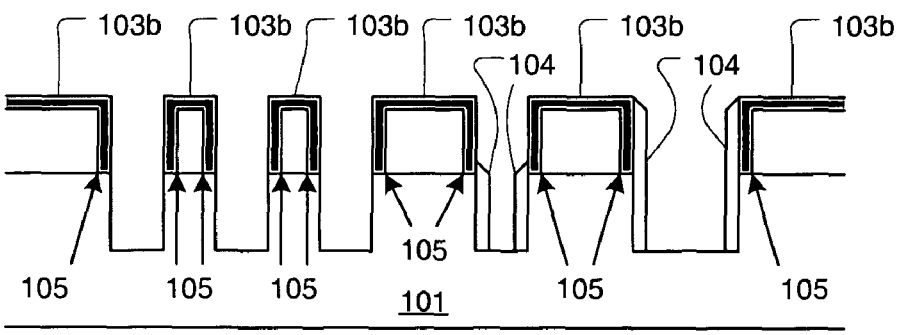
FIG. 1C is an illustration depicting the semiconductor wafer, photoresist crust, and polymer material of FIG. 1B following removal of the bulk photoresist portion using a conventional wet strip chemistry.

FIG. 1C is an illustration depicting the semiconductor wafer 101, photoresist crust 103b, and polymer material 104 of FIG. 1B following removal of the bulk photoresist portion 103a using a conventional wet strip chemistry. Due to the conventional wet strip chemistry being capable of removing the bulk photoresist portion 103a but not the photoresist crust 103b, the photoresist crust 103b remains attached to the semiconductor wafer 101 following the conventional wet strip process. It should be appreciated that due to the porous nature of the photoresist crust 103b, the conventional wet chemistry process is capable of penetrating through the photoresist crust 103b and removing the bulk photoresist portion 103a that underlies the photoresist crust 103b. Consequently, following the conventional wet strip process, a shell of photoresist crust 103b remains attached to each feature of the semiconductor wafer 101. Additionally, due to the chemical characteristics of the photoresist crust 103b, a tenacious bond exists between the photoresist crust 103b and the semiconductor wafer 101 at the interfaces 105 therebetween. Therefore, a method is needed to remove the photoresist crust 103b and polymer material 104 without damaging the underlying semiconductor wafer 101.

Figure 2:
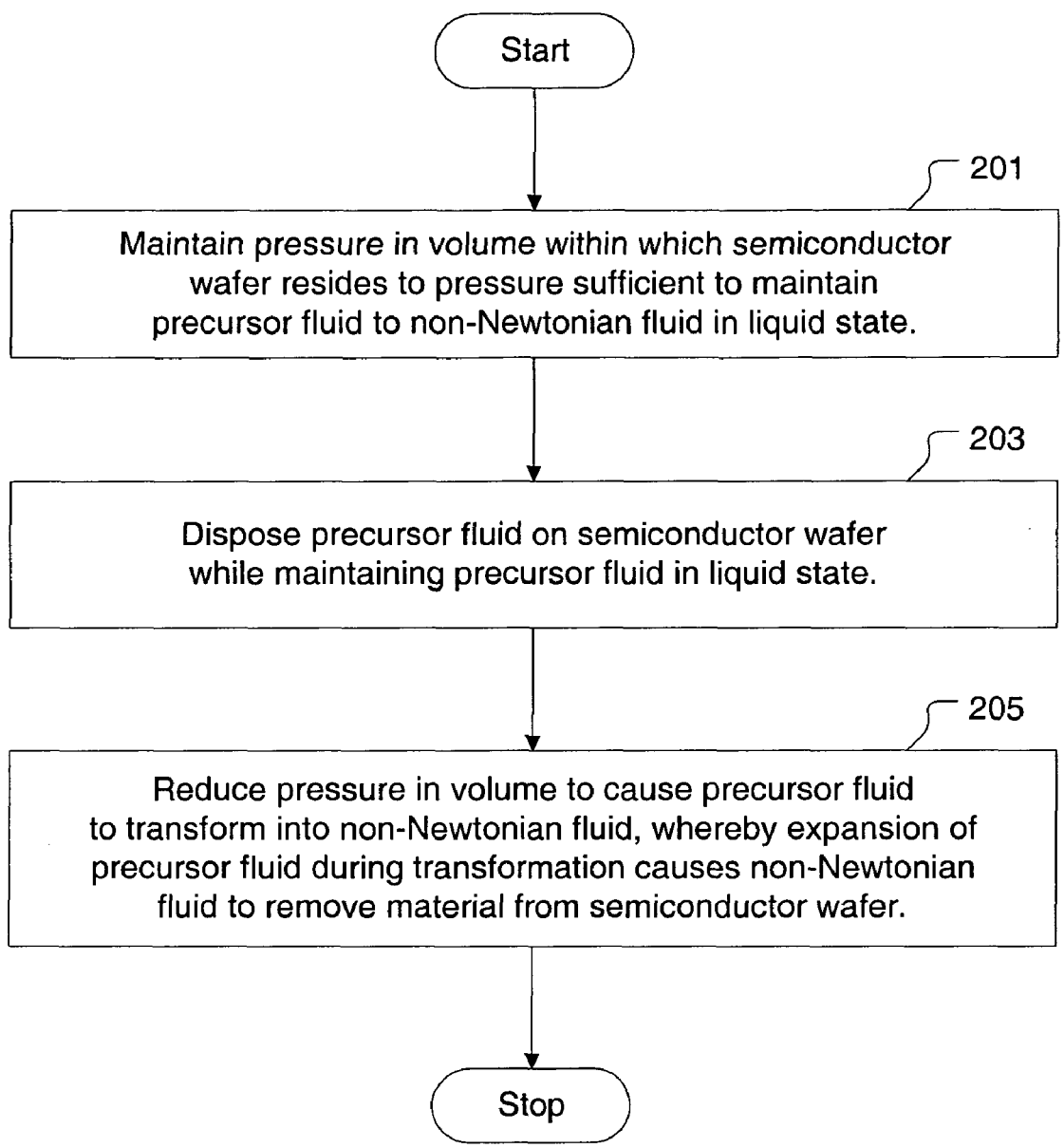
FIG. 2 is an illustration showing a flowchart of a method for removing material from a semiconductor wafer, in accordance with one embodiment of the present invention.

FIG. 2 is an illustration showing a flowchart of a method for removing material from a semiconductor wafer, in accordance with one embodiment of the present invention. The method includes an operation 201 for maintaining a pressure within a volume within which a semiconductor wafer resides to be sufficient to maintain a precursor fluid to a non-Newtonian fluid in a liquid state. In one embodiment, the volume is pressurized to greater than one atmosphere (1 atm) to maintain the precursor fluid in the liquid state. In another embodiment, the precursor fluid is formulated to be maintained in the liquid state at atmospheric (1 atm) pressure within the volume. In yet another embodiment, the precursor fluid is formulated to be maintained in the liquid state at a volume internal pressure less than one atmosphere (1 atm). The precursor fluid is described in more detail below. The method then proceeds with an operation 203 for disposing the precursor fluid on the semiconductor wafer while maintaining the precursor fluid in the liquid state. It should be understood that the precursor fluid in the liquid state is capable of being disposed within vias and between adjacent high-aspect ratio features defined on the semiconductor wafer. Additionally, the precursor fluid in the liquid state is capable of penetrating through the porous photoresist crust to reach vacant regions that may underlie the photoresist crust. Therefore, when the precursor fluid is disposed on the semiconductor wafer in the operation 203, the precursor fluid is disposed proximate to material that is to be removed from the semiconductor wafer. Examples of such materials to be removed from the semiconductor wafer can include photoresist, photoresist crust, polymer material, and essentially any other unwanted residual material.

Following the operation 203, the method proceeds with an operation 205 in which the pressure in the volume within which the semiconductor wafer resides is reduced to cause the precursor fluid to transform into the non-Newtonian fluid. A non-Newtonian fluid is a fluid in which the viscosity changes with the applied shear force. An example of a non-Newtonian fluid is a soft, condensed matter which occupies a middle ground between the extremes of a solid and a liquid, wherein the soft condensed matter is easily deformed by external stresses. Foam is one example of a non-Newtonian fluid, as referenced herein, wherein gas bubbles are defined within a liquid matrix. It should be appreciated, however, that the non-Newtonian fluid associated with the present invention is not limited to a particular type of foam.

A volume expansion of the precursor fluid during its transformation into the non-Newtonian fluid causes the resulting non-Newtonian fluid to remove the unwanted materials, e.g., photoresist crust, polymer material, etc., from the semiconductor wafer. It should be appreciated that as the precursor fluid transforms into the non-Newtonian fluid, expansion of the precursor fluid to the non-Newtonian fluid and the relative motion of the non-Newtonian fluid with respect to the substrate, i.e., semiconductor wafer, causes the non-Newtonian fluid to apply a mechanical force against the photoresist crust and polymer material such that the photoresist crust and polymer material are removed from the semiconductor wafer. Thus, the liquid to non-Newtonian fluid transformation of the precursor fluid present below and adjacent to the unwanted materials causes a mechanical removal of the unwanted materials from the semiconductor wafer.

Because the precursor fluid works its way uniformly into spaces between features present on the semiconductor wafer, the transformation of the precursor fluid into the non-Newtonian fluid with the accompanying expansion will exert substantially uniform hydrostatic pressure on each side of the features present on the semiconductor wafer. Therefore, the non-Newtonian fluid will not exert differential forces on semiconductor wafer features, thus avoiding damage to the features. Additionally, the non-Newtonian fluid acts to entrain the materials that are removed from the semiconductor wafer. Therefore, the removed materials such as photoresist crust and polymer material will not resettle on and re-adhere to the semiconductor wafer.

As discussed above, the precursor fluid has a liquid state when maintained above a particular pressure. When exposed to a low enough pressure, the precursor fluid transforms into the non-Newtonian fluid. For discussion purposes, the particular pressure below which the precursor fluid transforms into the non-Newtonian fluid is referred to as a transformation pressure of the precursor fluid. In one embodiment the precursor fluid is defined as a liquid having a propellant included therein by one of a number of methods such as dissolution, mixing, emulsification, etc. When the pressure is lowered below the transformation pressure, the propellant in the precursor fluid will expand to transform the precursor fluid into the non-Newtonian fluid.

The propellant in the precursor fluid is defined to maintain a liquid state above the transformation pressure and a gas state below the transformation pressure. For example, in one embodiment, propane ($C_3H_8$) can be used as the propellant. However, it should be understood that in other embodiments the propellant material can be essentially any material that satisfies the physical state requirements relative to the transformation pressure and is chemically compatible with the precursor fluid, the semiconductor wafer, and the processing environment/structures. At a pressure above the transformation pressure the propellant in the liquid state is added to the precursor fluid. In one embodiment, an amount of propellant added to the precursor fluid is within a range extending from about 5% by weight to about 20% by weight of the precursor fluid following addition of the propellant therein. The largest amount of propellant that can be dissolved in the precursor fluid is generally limited by the solubility of the propellant (in the liquid state) in the precursor fluid.

In one embodiment of the present invention, the transformation of the precursor fluid to the non-Newtonian is accomplished through a rapid decompression from a pressure greater than the transformation pressure to a pressure lower than the transformation pressure. In one embodiment, the pressure ambient to the precursor fluid is reduced at a rate such that the precursor fluid in the liquid state is transformed into the non-Newtonian fluid within a duration extending from about 0.01 second to about 2 seconds. As used herein, the term "about" refers to being within plus or minus twenty percent of a given value. In another embodiment, the pressure ambient to the precursor fluid is reduced at a rate such that the precursor fluid in the liquid state is transformed into the non-Newtonian fluid within a duration extending from about 0.05 second to about 0.2 second. In yet another embodiment, the pressure ambient to the precursor fluid is reduced at a rate such that the precursor fluid in the liquid state is transformed into the non-Newtonian fluid within a duration of about 0.01 second.

For the non-Newtonian fluid to exert a sufficient amount of force on the photoresist crust and polymer material to cause their removal from the semiconductor wafer, the volume ratio of the non-Newtonian fluid to the precursor fluid should be sufficiently large. In one embodiment, the volume of the non-Newtonian fluid following expansion of the propellant in the precursor fluid is within a range extending from about 2 times to about 100 times the volume of the precursor fluid in the liquid state. In another embodiment, the volume of the non-Newtonian fluid following expansion of the propellant in the precursor fluid is within a range extending from about 5 times to about 20 times the volume of the precursor fluid in the liquid state.

In one embodiment, the base precursor fluid, i.e., the non-propellant portion of the precursor fluid, is defined by adding various components to an amount of deionized water. For example, the base precursor fluid can be formulated to include surfactants for reducing surface tension and other additives capable of stabilizing bubbles that form during transformation of the precursor fluid into the non-Newtonian fluid. Examples of such additives can include fatty acids, cellulose, oils, and proteins, among others. The base precursor fluid can also include detergents and/or soaps. Additionally, hydrotropes can be included in the base precursor fluid to bind strongly to the surface of micelles, thus controlling the size of the micelles. Additives that are capable of reducing the adhesion at the interface between the photoresist crust and the semiconductor wafer can also be included in the base precursor fluid. In one embodiment, an amount of the wet strip chemistry used to remove the bulk photoresist can be added to the precursor fluid so that residual bulk photoresist can continue to be removed during the removal of the photoresist crust.

With reference to the method of FIG. 2, the ambient pressure relative to the semiconductor wafer during operations 201 and 203 can be maintained just above the transformation pressure. However, during operations 201 and 203, there is no specific limit on the ambient pressure from the precursor fluid perspective. Additionally, in some embodiments the propellant used in the precursor fluid may partially liquefy at pressures approaching the complete liquefication pressure of the propellant. In these embodiments, the precursor fluid can be defined to include an amount of propellant that is less than the amount of propellant expected at full liquefication pressure. Thus, in these embodiments, the ambient pressure relative to the semiconductor wafer during operations 201 and 203 can be maintained at a pressure less than but approaching the complete liquefication pressure of the propellant.

As the pressure is decreased below the transformation pressure and the propellant in the precursor fluid changes from liquid state to gas state, the propellant in the gas state will behave as an ideal gas. Thus, according to the ideal gas law (PV=nRT), the volume of the propellant in the gas state can be influenced by the temperature of the propellant in the gas state. At a given pressure, a higher gas temperature will reflect a correspondingly higher gas volume, vice-versa. It should also be appreciated that the pressure inside bubbles will be affected by the size of the bubbles and the surface tension of the liquid between the bubbles. At a fixed ambient pressure, smaller sized bubbles will have higher inside pressures relative to larger size bubbles. With an increased gas volume upon transition of the propellant from the liquid state to the gas state, the resulting non-Newtonian fluid will occupy an increased volume. Thus, the method of FIG. 2 can also include an operation for controlling a temperature to control the volume expansion of the precursor fluid during the transformation from the liquid state into the non-Newtonian fluid. It should be appreciated that the temperature should be controlled with consideration for preserving the chemistry of the precursor fluid.

Figure 3A:
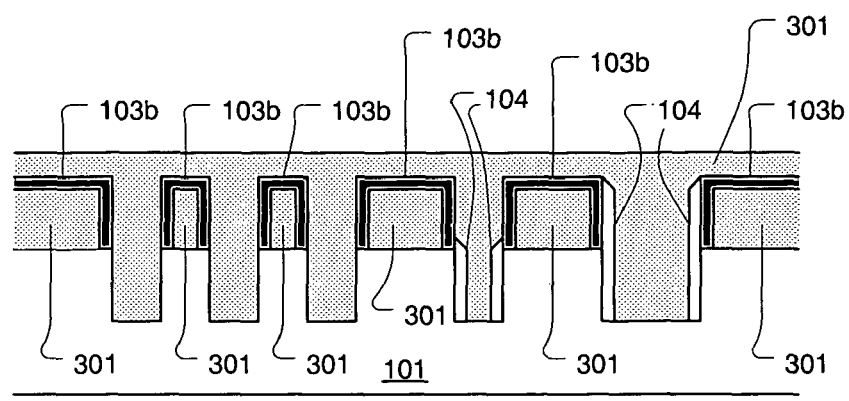
FIG. 3A is an illustration depicting the configuration of FIG. 1C following performance of operations 201 and 203 of the method of FIG. 2, in accordance with one embodiment of the present invention.

FIG. 3A is an illustration depicting the configuration of FIG. 1C following performance of operations 201 and 203 of the method of FIG. 2, in accordance with one embodiment of the present invention. As previously described a precursor fluid 301 in a liquid state is disposed on the semiconductor wafer 101. The precursor fluid 301 is disposed between features present on the semiconductor wafer 101. The precursor fluid 301 also penetrates through the porous photoresist crust 103b to regions underlying the photoresist crust 103b that were previously occupied by the bulk photoresist portion 103a. In one embodiment, the semiconductor wafer 101 can be subjected to a rinse and dry procedure prior to performing the method of FIG. 2.

Figure 3B:
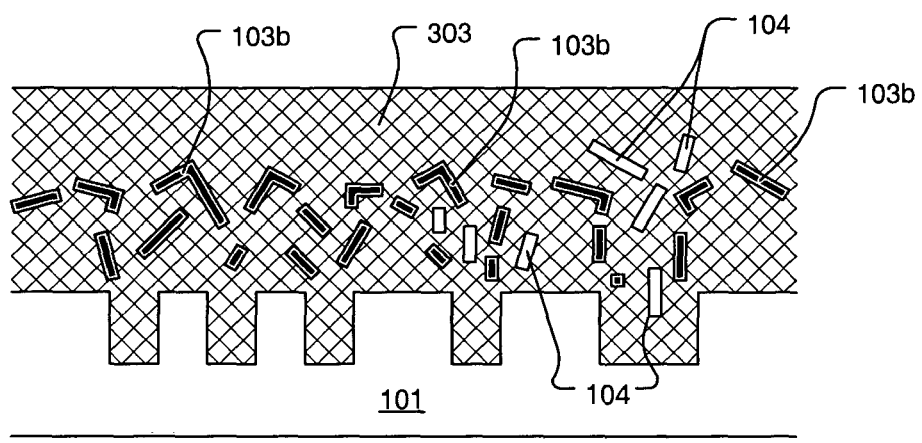
FIG. 3B is an illustration depicting the configuration of FIG. 3A following the operation 205 of the method of FIG. 2, in accordance with one embodiment of the present invention.
Figure 3C:
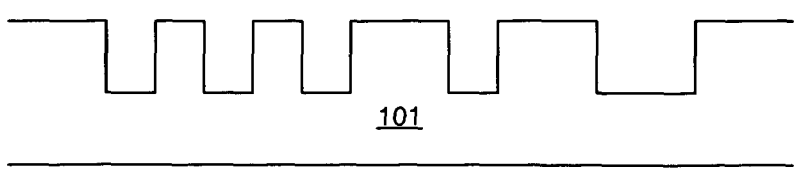
FIG. 3C is an illustration depicting the semiconductor wafer following a rinse and dry process to clean the removed photoresist crust, the removed polymer material, and non-Newtonian fluid from the semiconductor wafer, in accordance with one embodiment of the present invention.

FIG. 3B is an illustration depicting the configuration of FIG. 3A following the operation 205 of the method of FIG. 2, in accordance with one embodiment of the present invention. As previously discussed, in the operation 205, the pressure is reduced below the transformation pressure, thereby transforming the precursor fluid 301 into the non-Newtonian fluid 303. The fluid expansion and fluid motion associated with the transformation of the precursor fluid 301 into the non-Newtonian fluid 303 causes the non-Newtonian fluid to exert mechanical force on the photoresist crust 103b and polymer material 104, thereby removing the photoresist crust 103b and polymer material 104 from the semiconductor wafer 101. The removed photoresist crust 103b and polymer material become entrained in the non-Newtonian fluid 303, such that removed photoresist crust 103b and polymer material cannot resettle on and re-adhere to the semiconductor wafer 101. FIG. 3C is an illustration depicting the semiconductor wafer 101 following a rinse and dry process to clean the removed photoresist crust 103b, the removed polymer material 104, and non-Newtonian fluid 303 from the semiconductor wafer 101, in accordance with one embodiment of the present invention.

Figure 4:
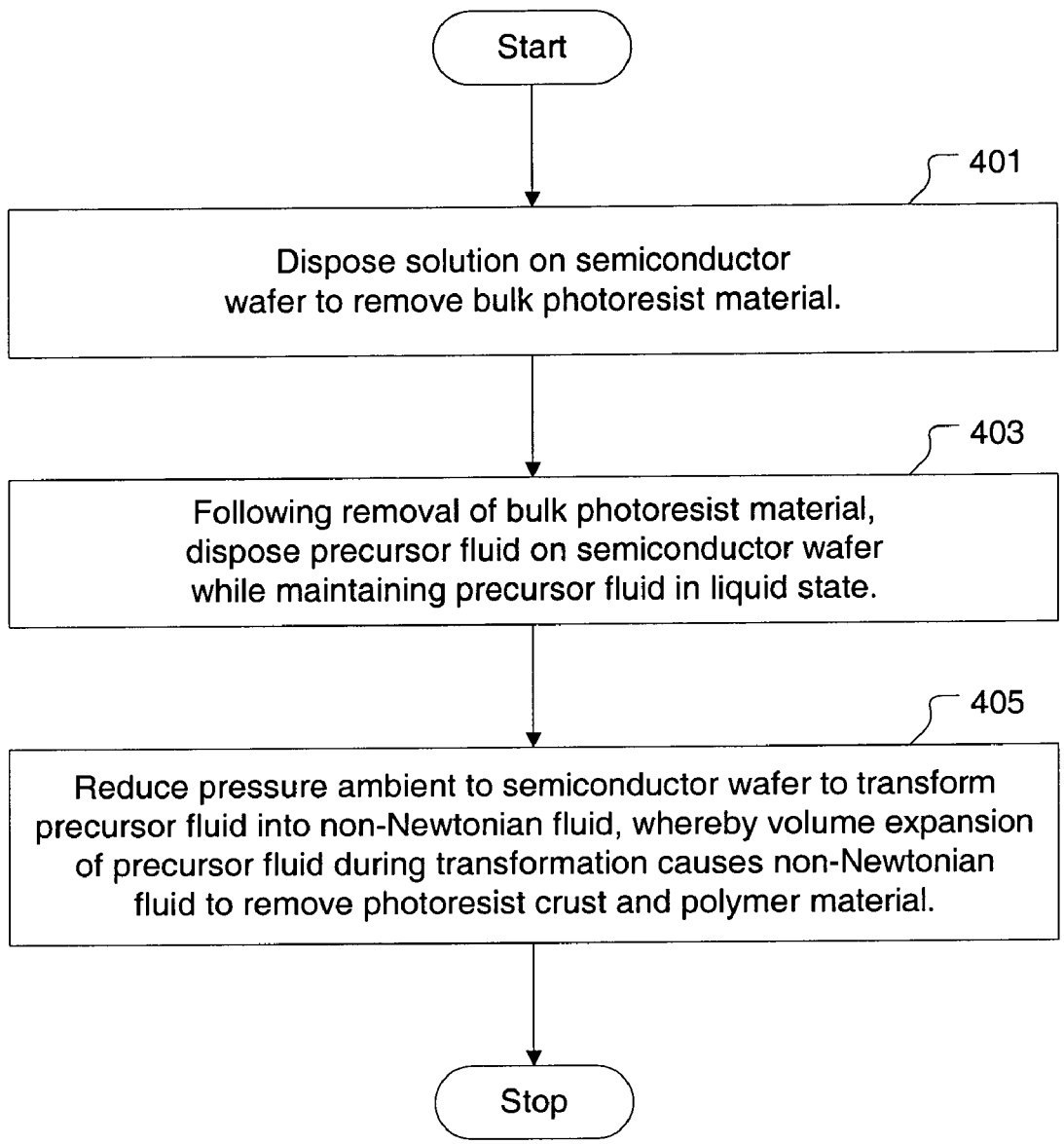
FIG. 4 is an illustration showing a flowchart of a method for removing photoresist and polymer material from a semiconductor wafer, in accordance with one embodiment of the present invention.

The method for removing photoresist crust from the semiconductor wafer, as previously described with respect to FIG. 2, can be incorporated as part of a method for general removal of photoresist material from a semiconductor wafer. FIG. 4 is an illustration showing a flowchart of a method for removing photoresist and polymer material from a semiconductor wafer, in accordance with one embodiment of the present invention. The method includes an operation 401 for disposing a solution on the semiconductor wafer to remove a bulk photoresist material. The disposed solution is capable of penetrating through a photoresist material to remove the bulk photoresist material while leaving a photoresist crust.

Following removal of the bulk photoresist material, the method continues with an operation 403 for disposing a precursor fluid to a non-Newtonian fluid on the semiconductor wafer. The precursor fluid of the present method is equivalent to the precursor fluid previously discussed. Thus, the precursor fluid is maintained in a liquid state when disposed on the semiconductor wafer. The precursor fluid is disposed to penetrate through the photoresist crust to vacant regions underlying the photoresist crust. Then, in an operation 405, a pressure ambient to the semiconductor wafer is reduced to transform the precursor fluid into the non-Newtonian fluid. A volume expansion of the precursor fluid during the transformation into the non-Newtonian fluid causes the non-Newtonian fluid to exert mechanical force on and remove the photoresist crust and polymer material.

Figure 5:
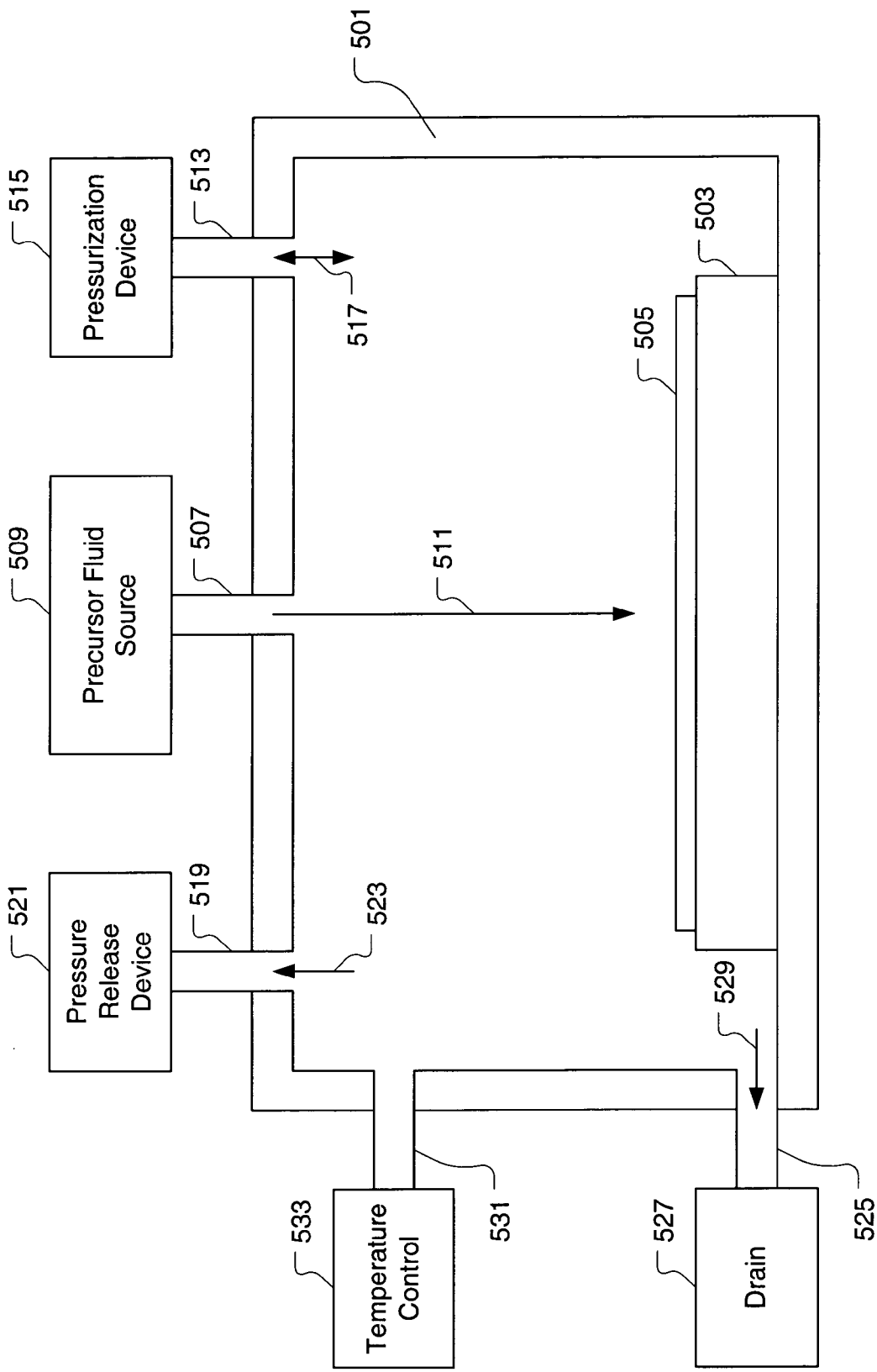
FIG. 5 is an illustration showing a processing chamber within which the method for removing material from the semiconductor wafer can be performed, in accordance with one embodiment of the present invention.

FIG. 5 is an illustration showing a processing chamber 501 within which the method for material from the semiconductor wafer can be performed as previously described, in accordance with one embodiment of the present invention. The chamber 501 is capable of maintaining a chamber internal pressure greater than the operating pressure at which the precursor fluid is maintained in the liquid state. A wafer support 503 is disposed within the chamber 501. The wafer support 503 is defined to hold a semiconductor wafer 505 during the material removal process.

The chamber 501 includes an input 507 connected to a precursor fluid source 509. During operation, the precursor fluid is provided from the precursor fluid source 509 through the input 507 to be disposed on the semiconductor wafer 505, as indicated by arrow 511. The chamber 501 also includes an input 513 connected to a pressurization device 515. During operation, the pressurization device 515 is used to control the pressure within the chamber 501 through addition or removal of a process atmosphere gas, as indicated by arrow 517. The chamber 501 further includes an input 531 connected to a temperature control 533. During operation the temperature control 533 is capable of conditioning the process atmosphere gas via the input 531 to maintain a desired temperature within the chamber 501. Also, in one embodiment, the temperature control 533 can be used to control a temperature of the wafer support 503 to in turn control a temperature of the semiconductor wafer 505.

A pressure release device 521 is connected to the chamber 501 through a connection 519. During operation, the pressure release device 521 is capable of rapidly releasing the pressure within the chamber 501, as indicated by arrow 523, to cause the precursor fluid to transform into the non-Newtonian fluid on the semiconductor wafer 505 surface. Following the transformation of the precursor fluid into the non-Newtonian fluid, the resulting non-Newtonian fluid and removed materials, e.g., photoresist and polymer material, can be removed through a connection 525 by a drain system 527, as indicated by arrow 529. It should be appreciated that to avoid obscuring the present invention many additional details of the chamber 501 have not been described herein. However, one skilled in the art will appreciated that the chamber 501 may include many features commonly associated with pressure chambers used for semiconductor wafer processing.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for removing material from a semiconductor wafer, comprising:
    maintaining a pressure within a volume within which a semiconductor wafer resides to be sufficient to maintain a precursor fluid to a non-Newtonian fluid in a liquid state, wherein the precursor fluid is a liquid having a propellant material in a liquid state, and wherein the precursor fluid includes one or more hydrotropes for controlling a size of micelles within the non-Newtonian fluid, wherein the one or more hydrotropes bind to surfaces of the micelles, and wherein the non-Newtonian fluid has a viscosity that changes with an applied shear force;
    applying the precursor fluid on the semiconductor wafer while maintaining the precursor fluid and propellant material therein in the liquid state, wherein the precursor fluid is disposed proximate to a photoresist crust material to be removed from the semiconductor wafer;
    allowing the precursor fluid to penetrate through the photoresist crust material to reach vacant regions that underlie the photoresist crust material; and
    reducing the pressure in the volume to cause the propellant material in the precursor fluid to transform from the liquid state into a gaseous state so as to cause the precursor fluid to transform into the non-Newtonian fluid, whereby an expansion of the precursor fluid during the transformation causes the non-Newtonian fluid to apply mechanical force to the photoresist crust material from within the vacant regions that underlie the photoresist crust material so as to remove the photoresist crust material from the semiconductor wafer.

2. A method for removing material from a semiconductor wafer as recited in claim 1, wherein expansion of the precursor fluid into the non-Newtonian fluid also applies mechanical force to remove a polymer material from the semiconductor wafer.

3. A method for removing material from a semiconductor wafer as recited in claim 1, further comprising:
    removing a bulk photoresist portion using a wet chemistry prior to disposing the precursor fluid on the semiconductor wafer, the removing being performed after an etch operation and such removing of the bulk photoresist portion being performed to leave the photoresist crust material, wherein the photoresist crust material is created during the etch operation.

4. A method for removing material from a semiconductor wafer as recited in claim 1, wherein the precursor fluid is capable of being disposed within vias and between high aspect ratio features on the semiconductor wafer, the precursor fluid capable of penetrating through the photoresist crust material to a region underlying the photoresist crust material.

5. A method for removing material from a semiconductor wafer as recited in claim 1, wherein an amount of propellant material included in the precursor fluid is within a range extending from about 5% by weight to about 20% by weight of the precursor fluid following inclusion of the propellant material.

6. A method for removing material from a semiconductor wafer as recited in claim 1, wherein the precursor fluid is defined to include surfactants and additives capable of stabilizing bubbles that form during transformation of the precursor fluid into the non-Newtonian fluid.

7. A method for removing material from a semiconductor wafer as recited in claim 1, wherein a volume of the non-Newtonian fluid is within a range extending from about 2 times to about 100 times the volume of the precursor fluid in the liquid state.

8. A method for removing material from a semiconductor wafer as recited in claim 1, further comprising:
    controlling a temperature to control the expansion of the precursor fluid during the transformation from the liquid state into the non-Newtonian fluid.

9. A method for removing material from a semiconductor wafer as recited in claim 1, wherein the pressure sufficient to maintain the precursor fluid and propellant material in the liquid state is greater than 1 atmosphere (atm).

10. A method for removing material from a semiconductor wafer as recited in claim 1, wherein the pressure sufficient to maintain the precursor fluid and propellant material in the liquid state is less than or equal to 1 atmosphere (atm).

11. A method for removing photoresist and polymer material from a semiconductor wafer, comprising:
    disposing a solution on a semiconductor wafer to remove a bulk photoresist material, wherein the solution penetrates through a photoresist material to remove the bulk photoresist material while leaving a photoresist crust;
    following removal of the bulk photoresist material, applying a precursor fluid to a non-Newtonian fluid on the semiconductor wafer, wherein the precursor fluid is a liquid having a propellant material in a liquid state, and wherein the precursor fluid includes one or more hydrotropes for controlling a size of micelles within the non-Newtonian fluid, wherein the one or more hydrotropes bind to surfaces of the micelles, and wherein the non-Newtonian fluid is a fluid having a viscosity that changes with an applied shear force, the precursor fluid and propellant material therein being maintained in the liquid state when disposed on the semiconductor wafer, the precursor fluid being disposed to penetrate through the photoresist crust to vacant regions underlying the photoresist crust and to be proximate to a polymer material present on the semiconductor wafer; and
    reducing a pressure ambient to the semiconductor wafer to cause the propellant material in the precursor fluid to transform from the liquid state into a gaseous state so as to cause the precursor fluid to transform into the non-Newtonian fluid, whereby an expansion of the precursor fluid during the transformation causes the non-Newtonian fluid to apply mechanical force to the photoresist crust and polymer materials so as to remove the photoresist crust and polymer materials from the semiconductor wafer.

12. A method for removing photoresist and polymer material from a semiconductor wafer as recited in claim 11, wherein photoresist crust and polymer material removed by the non-Newtonian fluid is entrained in the non-Newtonian fluid such that the removed photoresist crust and polymer material does not resettle on the semiconductor wafer.

13. A method for removing photoresist and polymer material from a semiconductor wafer as recited in claim 11, wherein reducing the pressure ambient to the semiconductor wafer is performed such that the precursor fluid in the liquid state is transformed into the non-Newtonian fluid within a duration extending from about 0.01 second to about 2 seconds.

14. A method for removing photoresist and polymer material from a semiconductor wafer as recited in claim 11, wherein the precursor fluid includes an amount of the solution used to remove the bulk photoresist material.

15. A method for removing photoresist and polymer material from a semiconductor wafer as recited in claim 11, wherein a volume of the non-Newtonian fluid is within a range extending from about 2 times to about 100 times the volume of the precursor fluid in the liquid state.

16. A method for removing material from a semiconductor wafer as recited in claim 1, wherein the one or more fatty acids included within the precursor fluid serve to stabilize bubbles that form during transformation of the precursor fluid into the non-Newtonian fluid.

17. A method for removing material from a semiconductor wafer as recited in claim 1, wherein the precursor fluid includes one or more fatty acids.

18. A method for removing material from a semiconductor wafer as recited in claim 1, wherein the precursor fluid includes wet photoresist stripping chemicals.

19. A method for removing material from a semiconductor wafer as recited in claim 1, wherein the precursor fluid includes cellulose to stabilize bubbles that form during transformation of the precursor fluid into the non-Newtonian fluid.

20. A method for removing material from a semiconductor wafer as recited in claim 1, wherein the precursor fluid includes an oil to stabilize bubbles that form during transformation of the precursor fluid into the non-Newtonian fluid.

21. A method for removing material from a semiconductor wafer as recited in claim 1, wherein the precursor fluid includes a protein to stabilize bubbles that form during transformation of the precursor fluid into the non-Newtonian fluid.

22. A method for removing material from a semiconductor wafer as recited in claim 1, whereby the expansion of the precursor fluid during the transformation causes the non-Newtonian fluid to exert a uniform hydrostatic pressure on each side of features present on the semiconductor wafer so as not to damage the features.

23. A method for removing photoresist and polymer material from a semiconductor wafer as recited in claim 11, wherein the precursor fluid includes one or more fatty acids.

* * * * *